United States Patent
Im et al.

(10) Patent No.: US 10,886,443 B2
(45) Date of Patent: Jan. 5, 2021

(54) LIGHT EMITTING DEVICE PACKAGE AND LIGHT EMITTING DEVICE PACKAGE MODULE

(71) Applicant: SAMSUNG ELECTRONICS CO., LTD., Suwon-si (KR)

(72) Inventors: Sang Kyun Im, Seoul (KR); Tetsuya Shigeta, Suwon-si (KR); Ho Seop Lee, Seoul (KR); Seong-Phil Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/100,524

(22) Filed: Aug. 10, 2018

(65) Prior Publication Data
US 2019/0051804 A1     Feb. 14, 2019

(30) Foreign Application Priority Data
Aug. 11, 2017    (KR) .................. 10-2017-0102300

(51) Int. Cl.
| | | |
|---|---|---|
| *H01L 33/62* | (2010.01) | |
| *H01L 33/50* | (2010.01) | |
| *H01L 33/44* | (2010.01) | |
| *H01L 25/075* | (2006.01) | |

(52) U.S. Cl.
CPC .............. *H01L 33/62* (2013.01); *H01L 33/50* (2013.01); *H01L 33/502* (2013.01); *H01L 25/0753* (2013.01); *H01L 33/44* (2013.01)

(58) Field of Classification Search
CPC ........ H01L 33/62; H01L 33/50; H01L 33/502
See application file for complete search history.

(56) References Cited

U.S. PATENT DOCUMENTS

| | | | | |
|---|---|---|---|---|
| 4,322,628 A | * | 3/1982 | Tanaka ................ | G01L 19/0084 250/551 |
| 5,573,107 A | * | 11/1996 | Nakano ................ | H01H 13/702 200/311 |
| 5,696,862 A | * | 12/1997 | Hauer .................. | G02B 6/4214 385/14 |

(Continued)

FOREIGN PATENT DOCUMENTS

| | | |
|---|---|---|
| CN | 106328635 A | 1/2017 |
| JP | 2002-111073 A | 4/2002 |

(Continued)

OTHER PUBLICATIONS

International Search Report and Written Opinion of the International Searching Authority or the declaration in corresponding International Application No. PCT/KR2018/009188, dated Jan. 30, 2019 (PCT/ISA/220).

(Continued)

*Primary Examiner* — Ida M Soward
(74) *Attorney, Agent, or Firm* — Sughrue Mion, PLLC

(57) ABSTRACT

A light emitting device package includes a light emitting device that generates light, a body frame including a cavity in which the light emitting device is mounted, a molding material that fills the cavity, and absorbing pigments that convert the light generated by the light emitting device. The absorbing pigments have a peak value within a wavelength range of 490 to 520 nm and a full width at half maximum (FWHM) of 40 to 70 nm.

14 Claims, 12 Drawing Sheets

(56) References Cited

U.S. PATENT DOCUMENTS

| | | | | |
|---|---|---|---|---|
| 5,809,050 | A * | 9/1998 | Baldwin | H01S 5/02296 257/80 |
| 5,841,128 | A * | 11/1998 | Shibuya | H01L 31/167 250/208.1 |
| 5,940,550 | A * | 8/1999 | Plickert | G02B 6/4212 385/14 |
| 7,295,592 | B2 * | 11/2007 | Hiramatsu | H01S 5/02228 372/101 |
| 7,804,147 | B2 * | 9/2010 | Tarsa | H01L 33/58 257/431 |
| 8,524,118 | B2 * | 9/2013 | Kim | C09K 11/0883 252/301.4 F |
| 8,896,005 | B2 * | 11/2014 | Van De Ven | H01L 33/52 257/98 |
| 9,000,470 | B2 * | 4/2015 | Tudorica | H01L 33/56 257/87 |
| 9,318,668 | B2 * | 4/2016 | Hong | C09K 11/7721 |
| 9,537,062 | B2 * | 1/2017 | Hagelaar | H01L 33/486 |
| 9,728,687 | B2 * | 8/2017 | Stott | H01L 33/507 |
| 9,859,475 | B2 * | 1/2018 | Song | H01L 33/504 |
| 9,909,058 | B2 * | 3/2018 | Yoo | C09K 11/0883 |
| 10,074,782 | B2 * | 9/2018 | Kawano | H01L 33/504 |
| 10,685,940 | B2 * | 6/2020 | Steckel | G02F 1/133603 |
| 2004/0012027 | A1 * | 1/2004 | Keller | H01L 33/50 257/79 |
| 2007/0024173 | A1 * | 2/2007 | Braune | H01L 33/502 313/485 |
| 2007/0247829 | A1 * | 10/2007 | Fiedler | C09K 11/7734 362/34 |
| 2010/0091491 | A1 * | 4/2010 | Jiang | F21V 5/04 362/235 |
| 2010/0283381 | A1 * | 11/2010 | Takahashi | C04B 35/597 313/503 |
| 2011/0180780 | A1 * | 7/2011 | Yoo | C09K 11/0883 257/13 |
| 2011/0235309 | A1 * | 9/2011 | Miki | C04B 35/597 362/97.2 |
| 2011/0303940 | A1 | 12/2011 | Lee et al. | |
| 2012/0319155 | A1 * | 12/2012 | Yoshimura | C09K 11/64 257/98 |
| 2014/0361331 | A1 * | 12/2014 | Konishi | H01L 24/97 257/98 |
| 2015/0014725 | A1 | 1/2015 | Hong et al. | |
| 2015/0022998 | A1 * | 1/2015 | Tao | C09K 11/7774 362/84 |
| 2015/0083967 | A1 * | 3/2015 | Watanabe | H01L 33/501 252/301.4 R |
| 2015/0117024 | A1 * | 4/2015 | Min | F21V 5/04 362/308 |
| 2015/0162506 | A1 * | 6/2015 | Lee | H01L 33/502 438/29 |
| 2015/0166342 | A1 * | 6/2015 | Liu | B82Y 30/00 252/301.6 S |
| 2015/0236224 | A1 * | 8/2015 | Kwak | H01L 33/504 362/612 |
| 2016/0104820 | A1 * | 4/2016 | Lim | H01L 33/504 257/98 |
| 2016/0218254 | A1 * | 7/2016 | Jacobson | H01L 33/504 |
| 2016/0240750 | A1 * | 8/2016 | Moon | H01L 25/0753 |
| 2016/0284948 | A1 | 9/2016 | Song et al. | |
| 2016/0284959 | A1 * | 9/2016 | Ishikawa | H01L 25/0753 |
| 2016/0285053 | A1 * | 9/2016 | Rohatgi | H01L 51/5268 |
| 2017/0025589 | A1 * | 1/2017 | Chang | H01L 33/56 |
| 2017/0040301 | A1 * | 2/2017 | Yamamoto | H01L 33/62 |
| 2017/0186141 | A1 | 6/2017 | Ha et al. | |
| 2017/0194535 | A1 * | 7/2017 | Park | G02B 6/0015 |
| 2017/0200869 | A1 * | 7/2017 | Lange | H01L 33/504 |
| 2017/0229512 | A1 * | 8/2017 | Akagawa | G02B 6/0068 |
| 2017/0233690 | A1 * | 8/2017 | Pickett | A01G 7/045 435/292.1 |
| 2017/0236866 | A1 * | 8/2017 | Lee | H01L 27/156 257/89 |
| 2017/0261425 | A1 * | 9/2017 | Deliwala | A61B 5/681 |
| 2019/0031954 | A1 * | 1/2019 | Okura | F21K 9/64 |
| 2019/0137332 | A1 * | 5/2019 | Chu | G01J 1/0407 |
| 2019/0237636 | A1 * | 8/2019 | Oh | C09K 11/616 |
| 2019/0363225 | A1 * | 11/2019 | Oh | C09K 11/616 |

FOREIGN PATENT DOCUMENTS

| | | |
|---|---|---|
| JP | 2012-027298 A | 2/2012 |
| JP | 2013-110154 A | 6/2013 |
| JP | 2016-092401 A | 5/2016 |
| KR | 10-2013-0084506 A | 7/2013 |
| KR | 10-2014-0063139 A | 5/2014 |
| KR | 10-2016-0080486 A | 7/2016 |
| WO | 2017/010076 A1 | 1/2017 |

OTHER PUBLICATIONS

International Search Report (PCT/ISA/210), issued by International Searching Authority in corresponding International Application No. PCT/KR2018/009188, dated Jan. 30, 2019.

Written Opinion (PCT/ISA/237) issued by the International Searching Authority in corresponding International Application No. PCT/KR2018/009188, dated Jan. 30, 2019.

Xiaoyu Wei et al. "Preparation of $SiO_2$/dye luminescent nanoparticles and their application in light-converting films" Royal Society of Chemistry, vol. 4, 2014 (pp. 50086-50090).

Communication dated Jun. 16, 2020 issued by the European Intellectual Property Office in counterpart European Application No. 18844910.2.

* cited by examiner

LIGHT EMITTING DEVICE PACKAGE AND LIGHT EMITTING DEVICE PACKAGE MODULE

CROSS-REFERENCE TO RELATED APPLICATIONS

This application is based on and claims priority under 35 U.S.C. § 119 to Korean Patent Application No. 10-2017-0102300, filed on Aug. 11, 2017, in the Korean Intellectual Property Office, the disclosure of which is incorporated by reference herein in its entirety.

BACKGROUND

1. Field

The disclosure relates to a light emitting device package including absorbing pigments to satisfy a DCI-P3 reference, and a light emitting device package module for the same.

2. Description of the Related Art

DCI-P3 color gamut is a common RGB color space for digital movie projection in the U.S. film industry. In CIE 1931 xy chromaticity diagram, the DCI-P3 color space covers 45.5% of all chromaticities and 86.9% of Pointer's gamut.

Currently, many theaters use digital cinema projectors to screen movies. In order to satisfy DCI-P3 reference, a light source of a digital cinema projector has been implemented as a xenon lamp or a laser diode.

For example, the xenon lamp must be replaced every few months, has difficulty in screening movies with a given brightness or higher, and cannot implement a High Dynamic Range (HDR) function capable of raising brightness of a specific image part by 5 to 10 times (70 to 150 fl).

SUMMARY

Additional aspects will be set forth in part in the description which follows and, in part, will be obvious from the description, or may be learned by practice.

In accordance with an aspect of the disclosure, a light emitting device package includes a light emitting device configured to generate light; a body frame including a cavity in which the light emitting device is mounted; a molding material that fills the cavity; and absorbing pigments that convert the light generated by the light emitting device, wherein the absorbing pigments have a peak value within a wavelength range of 490 nm to 520 nm and a full width at half maximum (FWHM) of 40 nm to 70 nm.

The absorbing pigments may be included in the molding material.

The light emitting device package may include a film provided over the molding material, wherein the absorbing pigments may be included in the film.

The absorbing pigments may be provided in at least one from among dyes and pigments.

The absorbing pigments may convert green (G) light generated by the light emitting device into light having a wavelength band of 540 nm to 545 nm.

The absorbing pigments may convert blue (B) light generated by the light emitting device into light having a wavelength band of 460 nm to 464 nm.

The light emitting device package may include a plurality of light emitting devices mounted in the cavity.

In accordance with another aspect of the disclosure, a light emitting device package module includes a plurality of light emitting device packages; and absorbing pigments that convert light generated by the light emitting device packages, wherein the absorbing pigments have a peak value within a wavelength range of 490 to 520 nm and a full width at half maximum (FWHM) of 40 to 70 nm.

Each light emitting device package among the plurality of light emitting device packages may include: a light emitting device configured to generate light, a body frame including a cavity in which the light emitting device is mounted, a molding material that fills the cavity, and the absorbing pigments included in the molding material.

The light emitting device package module may include a molding layer enclosing the plurality of light emitting device packages.

The absorbing pigments may be included in the molding layer.

The light emitting device package module may include a film provided over the molding layer, wherein the absorbing pigments may be included in the film.

The absorbing pigments may be provided in at least from among dyes and pigments.

The absorbing pigments may convert green (G) light generated by the light emitting device into light having a wavelength band of 540 to 545 nm.

The absorbing pigments may convert blue (B) light generated by the light emitting device into light having a wavelength band of 460 to 464 nm.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
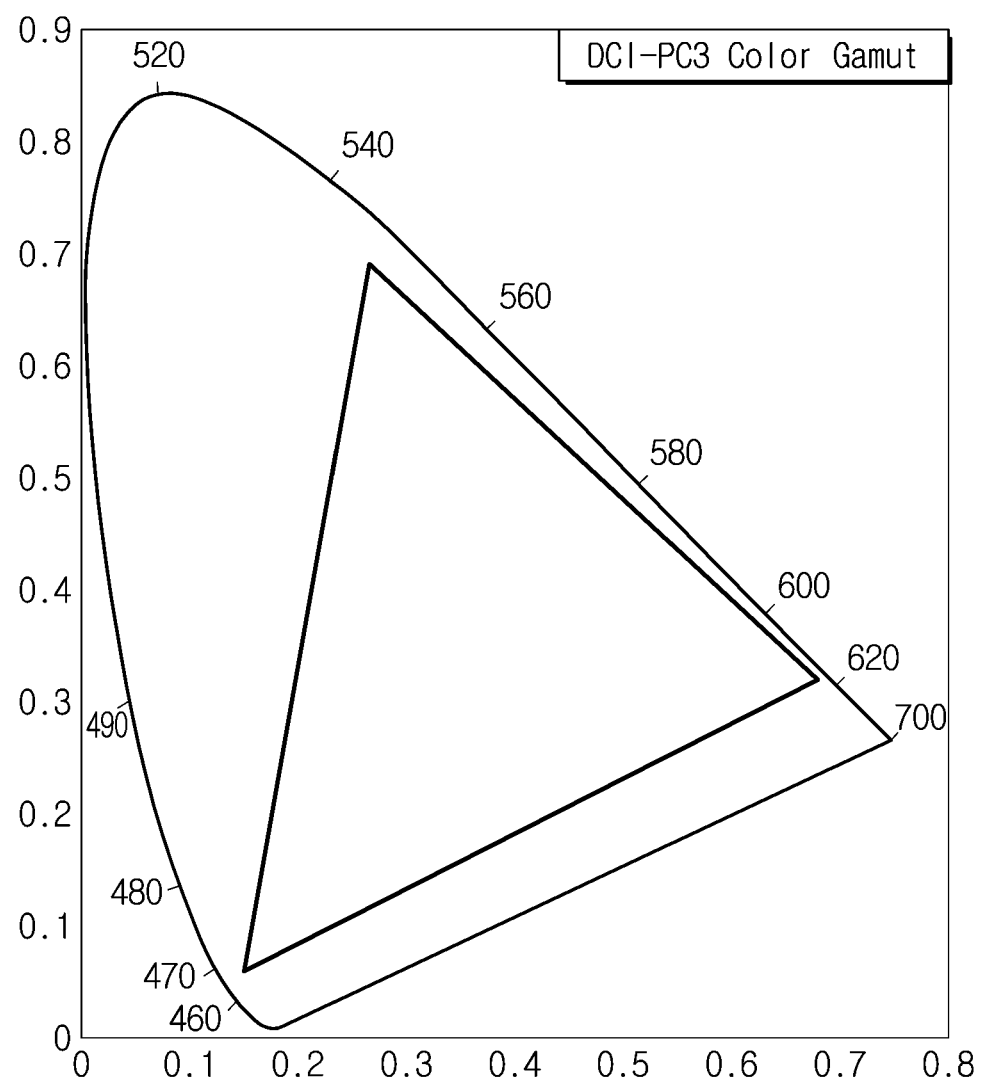
FIG. 1 is a view illustrating a DCI-P3 color gamut according to an embodiment.

Reference will now be made in detail to the embodiments, examples of which are illustrated in the accompanying drawings, wherein like reference numerals refer to like elements throughout. A light emitting device package and a light emitting device package module according to the embodiments will hereinafter be described with reference to the attached drawings.

The disclosure relates to providing a light emitting device package having absorbing pigments in a manner that light emitted from the light emitting device package satisfies the DCI-P3 color gamut reference, and a display apparatus including the same. In more detail, each of the absorbing pigments has a peak value within a wavelength range from 490 to 520 nm, and has a full width at half maximum (FWHM) of 40 to 70 nm.

A light emitting device package and a light emitting device package module according to the embodiments may provide a display apparatus for movie screening, and specific absorbing pigments for satisfying the DCI-P3 color gamut reference may be included in the light emitting device package.

The light emitting device package module according to the disclosure may refer to modularization of a plurality of light emitting device packages.

The DCI-P3 color gamut reference to be implemented by the light emitting device package will hereinafter be described with reference to the attached drawings.

FIG. 1 is a view illustrating the DCI-P3 color gamut according to an embodiment. Color coordinates of the DCI-P3 Color Gamut are shown in the following Table 1.

TABLE 1

| Categories | DCI-P3 Color Gamut Color Coordinates | |
|---|---|---|
| | DCI-P3_x | DCI-P3_y |
| Red(R) | 0.680 | 0.320 |
| Green(G) | 0.265 | 0.690 |
| Blue(B) | 0.150 | 0.060 |

The light emitting device package according to the disclosure aims to satisfy the DCI-P3 color gamut reference shown in FIG. 1 and Table 1. In other words, light generated by the light emitting device package aims to cover the region composed of Red(R)(0.680, 0.320), Green(G)(0.265, 0.690), and Blue(B)(0.150, 0.060) in CIE 1931 color coordinates.

To this end, the disclosure may provide a cinema light emitting device package having specifications shown in the following Table 2 in individual color regions, and a display apparatus including the same.

TABLE 2

| LED color | Wavelength | Conditions |
|---|---|---|
| Red | 618~623 nm | Driving current basis, |
| Green | 540~545 nm | Brightness Range 14~146 fl |
| Blue | 460~464 nm | (48 nit~500 nit) |

The light emitting device package according to an embodiment may be configured to accommodate absorbing pigments having a specific wavelength and a Full Width at Half Maximum (FWHM), thereby satisfying the DCI-P3 color gamut reference. Embodiments will hereinafter be described with reference to the attached drawings.

Figure 2:
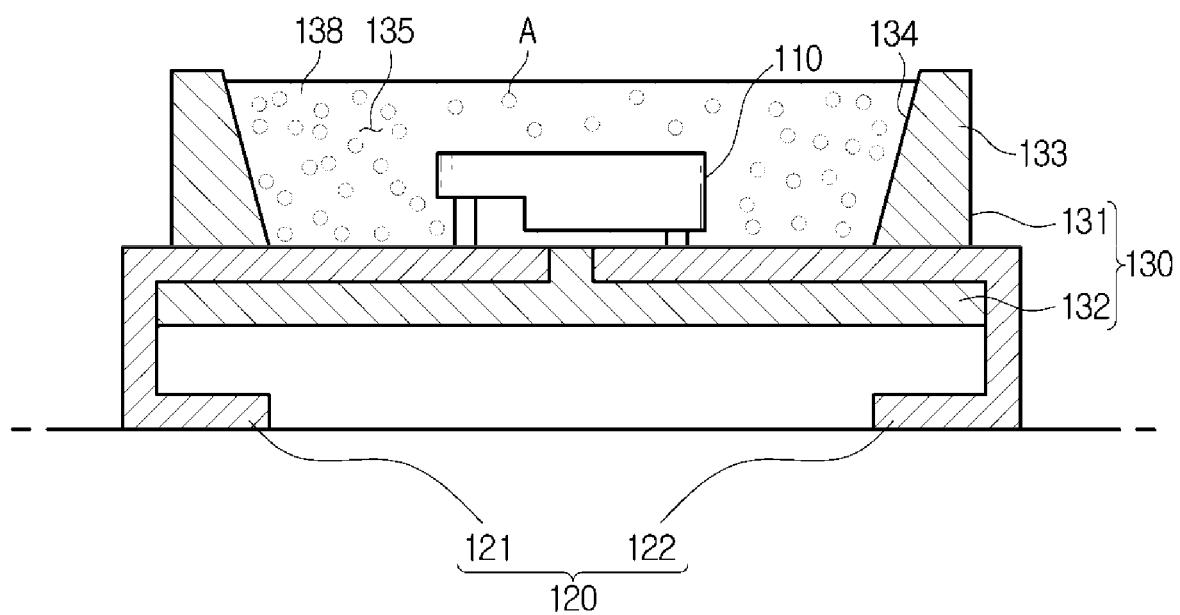
FIG. 2 is a cross-sectional view illustrating a light emitting device package according to an embodiment.
Figure 3:
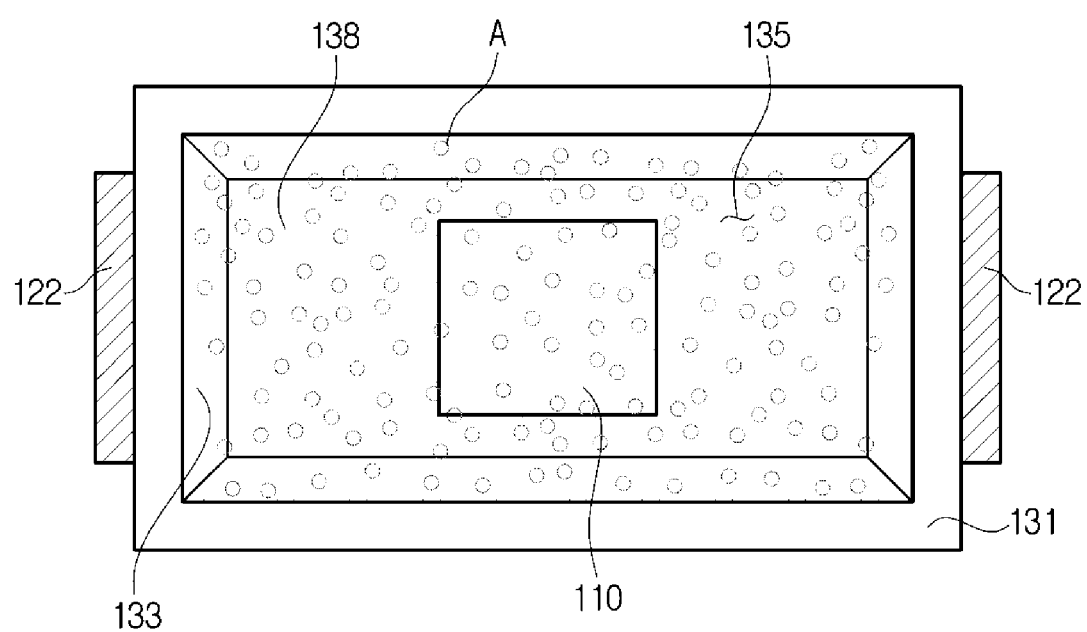
FIG. 3 is a perspective view illustrating the light emitting device package shown in FIG. 2.

FIG. 2 is a cross-sectional view illustrating a light emitting device package 100 according to an embodiment. FIG. 3 is a perspective view illustrating the light emitting device package 100 shown in FIG. 2.

Referring to FIGS. 2 and 3, the light emitting device package 100 may include a light emitting device 110 to generate light, a lead frame 120 electrically connected to the light emitting device 110 to form at least one region located at a bottom surface of a cavity 135, and a body frame 130 provided with the cavity 135 to accommodate the light emitting device 110 therein.

The light emitting device 110 may include all kinds of structures capable of generating light. For example, the light emitting device 110 may include at least one light emitting diode.

The light emitting diode may have a stacked compound semiconductor including a PN junction structure, and may include an N-type semiconductor layer, a P-type semiconductor layer, and a light emitting layer disposed between the N-type semiconductor layer and the P-type semiconductor layer.

In the light emitting diode, electrons and holes may be injected into the light emitting layer when forward electric field is applied to the N-type semiconductor layer and the P-type semiconductor layer, and the electrons and holes injected into the light emitting layer are recombined to emit light, such that the light emitting device may generate and emit the light.

The light emitting device 110 may emit monochromatic light of a red(R), green(G), or blue(B) wavelength band. The disclosure aims to provide a light emitting device package 100 matched with the DCI-P3 color gamut reference by converting a color region of the monochromatic light having the green(G) wavelength band and a color region of the monochromatic light having the blue(B) wavelength band. The embodiments will hereinafter be described using an example case in which the light emitting device package 100 includes a light emitting device 110 configured to emit monochromatic light having the green(G) wavelength band and monochromatic light having the blue(B) wavelength band.

The light emitting diode may be broadly classified into a laterally structured light emitting diode and a vertically structured light emitting diode. The laterally structured light emitting diode may be classified into a top-emitting light emitting diode and a flip-chip light emitting diode.

The flip-chip light emitting diode may be formed to emit light through a sapphire substrate. The light emitting diode may be die-attached to a submount (for example, a lead frame 120), and light generated by the light emitting diode may be emitted through one surface of the diode that is not die-attached to the submount.

The light emitting device 110 will hereinafter be described using the flip-chip light emitting diode as an example.

Figure 4:
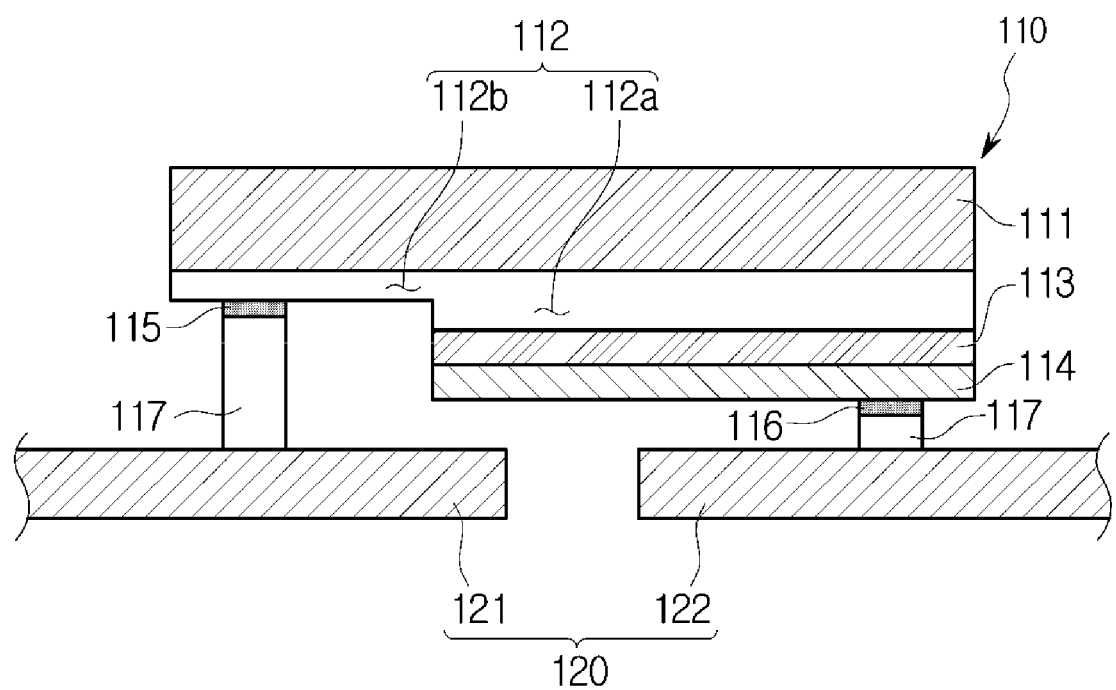
FIG. 4 is a cross-sectional view illustrating a light emitting device according to an embodiment.

FIG. 4 is a cross-sectional view illustrating a light emitting device 110 according to an embodiment.

Referring to FIG. 4, the light emitting device 110 may have a sequentially stacked structure of a substrate 111, an N-type semiconductor layer 112, a light emitting layer 113, and a P-type semiconductor layer 114.

The substrate 111 may be formed of a transparent material having sapphire. The substrate 111 may be formed of sapphire, and may also be formed of zinc oxide (ZnO), gallium nitride (GaN), silicon carbide (SiC), aluminum nitride (AlN), etc.

A buffer layer may be formed between the substrate 111 and the N-type semiconductor layer 112. The buffer layer may be configured to improve lattice matching with the substrate 111 before the N-type semiconductor layer 112 is grown on the substrate 111, and the buffer layer may be omitted according to fabrication conditions and element characteristics.

The N-type semiconductor layer 112 may be formed of a semiconductor material having the formula InxAlyGa(1-x-y)N (where 0≤X, 0≤Y, X+Y≤1). More particularly, the N-type semiconductor layer 112 may be formed of a GaN or GaN/AlGaN layer doped with N-type conductive impurities. For example, the N-type conductive impurities may be formed of silicon (Si), germanium (Ge), tin (Sn), etc.

The N-type semiconductor layer 112 may be classified into a first region 112a and a second region 112b. The first region 112a may be used to define a light emitting surface. In order to improve optical characteristics of the light emitting device 110, the first region 112a may be larger in size than the second region 112b.

The light emitting layer 113 and the P-type semiconductor layer 114 are sequentially stacked in the first region 112a, thereby forming a light emitting structure.

The light emitting layer 113 may be formed of an InGaN/GaN layer having a multi-quantum well structure. The P-type semiconductor layer 114 may be formed of a semiconductor material having formula InxAlyGa(1-x-y)N (where 0≤X, 0≤Y, X+Y≤1). More particularly, the P-type semiconductor layer 114 may be formed of a GaN or GaN/AlGaN layer doped with P-type conductive impurities. For example, the P-type conductive impurities may be formed of magnesium (Mg), zinc (Zn), beryllium (Be), etc.

An N-type electrode 115 may be formed over the N-type semiconductor layer 112, and a P-type electrode 116 may be formed over the P-type semiconductor layer 114.

An adhesive layer 117 may be formed of a stacked structure of a plurality of metal layers, each of which includes a single element. In order to prevent reflectance of the lead frame 120 from affecting characteristics of the light emitting device 110, the adhesive layer 117 may include a reflective material. For example, the adhesive layer 117 may be formed of a metal having tin (Sn) or silver (Ag).

Although the N-type semiconductor layer 112 formed at an upper part of the LED package and the P-type semiconductor layer 114 formed at a lower part of the LED package are shown in FIG. 3, it should be noted that the P-type semiconductor layer 114 may be formed at the upper part of the LED package and the N-type semiconductor layer 112 may be formed at the lower part of the LED package as necessary.

One or more light emitting devices 110 may be mounted on the light emitting device package 100. For example, this embodiment is an example in which only one light emitting device 110 is mounted on the light emitting device package 100.

The lead frame 120 may reflect light generated by the light emitting device 110 by forming the bottom surface of the cavity 135, and may provide the light emitting device 110 with external power.

The lead frame 120 may be formed to have a monolayer structure or a multilayer structure. As shown in FIG. 4, two lead frames 120 or multiple lead frames 120 may be used.

The lead frame 120 may have a monolayer structure, and the lead frame 120 may include a first lead frame 121 and a second lead frame 122. Referring to FIGS. 1 and 2, one side of the first lead frame 121 and one side of the second lead frame 122 may be inserted between an upper body frame 131 and a lower body frame 132, and the other side of the first lead frame 121 and the other side of the second lead frame 122 may be formed to enclose the lower body frame 132.

The light emitting device 110 may be attached to the first lead frame 121 or the second lead frame 122, or may be attached over the first lead frame 121 and the second lead frame 122.

When the light emitting device 110 is attached to an upper part of the first lead frame 121 or the second lead frame 122, the light emitting device 110 may be electrically connected to the second lead frame 122 or the first lead frame 121 through wire bonding. When the light emitting device 110 is attached over the first lead frame 121 and the second lead frame 122, the light emitting device 110 may be attached to the top surface of each lead frame 120 through the adhesive layer 117. An example case in which the light emitting device 110 is attached to the lead frame 120 through the adhesive layer 117 has been illustrated in FIGS. 1 and 2.

The lead frame 120 may include at least one selected from a group that includes titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe).

The first lead frame 121 and the second lead frame 122 may be spaced apart from each other, such that the first lead frame 121 and the second lead frame 122 may be electrically isolated from each other. Each read frame 120 may form at least one region located at the bottom surface of the cavity 135.

The body frame 130 may support and protect the light emitting device 110, and may include the upper body frame 131 and the lower body frame 132.

The body frame 130 may be formed of at least one of a resin such as polyphthalamide (PPA), silicon (Si), aluminum (Al), aluminum nitride (AlN), photosensitive glass (PSG), polyamide 9T (PA9T), syndiotactic polystyrene (SPS), metal, sapphire (Al2O3), and beryllium oxide (BeO).

Although the body frame 130 may be formed by injection molding, etching process, etc., embodiments are not limited thereto.

The upper body frame 131 may be formed to be concave in a manner that a diameter thereof is gradually reduced in the range from an upper part to a lower part thereof, and may have the cavity 135 through which the lead frame 120 is exposed. Although the cavity 135 may be larger in width and height than the light emitting device 110, embodiments are not limited thereto.

The upper body 131 may include a wall part 133 enclosing the plurality of cavities 135. An inner surface 134 of the wall part 133 may be formed to have a tilted surface. A reflective angle of light emitted from the light emitting device 110 may be changed according to an angle of the tilted surface, such that a directional angle of the light emitted outside can be adjusted. The lower the directional angle of light, the higher the concentration of light emitted outside. In contrast, the higher the directional angle of light, the lower the concentration of light emitted from the light emitting device 110.

The cavity 135 may be filled with a molding material 138 that protects the light emitting device from the outside by enclosing the light emitting device. The cavity 135 may be filled with the molding material 138 covering a side of the light emitting device 110, such that the molding material 138 may isolate the light emitting device 110 from the outside to protect the light emitting device from external invasive material or the like.

The molding material 138 filling the cavity 135 may be formed to be concave in the range from the upper part to the lower part thereof, and may also be formed to have a planar shape or a convex shape. If the upper part of the molding material 138 is formed to be concave, the directional angle of light emitted outside may decrease and concentration of light may increase. If the upper part of the molding material 138 is formed to have a convex shape, the directional angle of light emitted outside may increase and concentration of light may decrease.

The molding material 138 may be formed of silicon epoxy or another resin material that has superior watertightness, superior corrosion resistance, and superior insulation characteristics, and may be formed using ultraviolet (UV) light or thermosetting characteristics.

The molding material 138 may include absorbing pigments (A) through which a wavelength of light generated by the light emitting device 110 is changed, so that the resultant light can be matched with the DCI-P3 reference. The absorbing pigments (A) may perform conversion of monochromatic light having a green(G) or blue(B) wavelength band emitted from the light emitting device 110.

Figure 5:
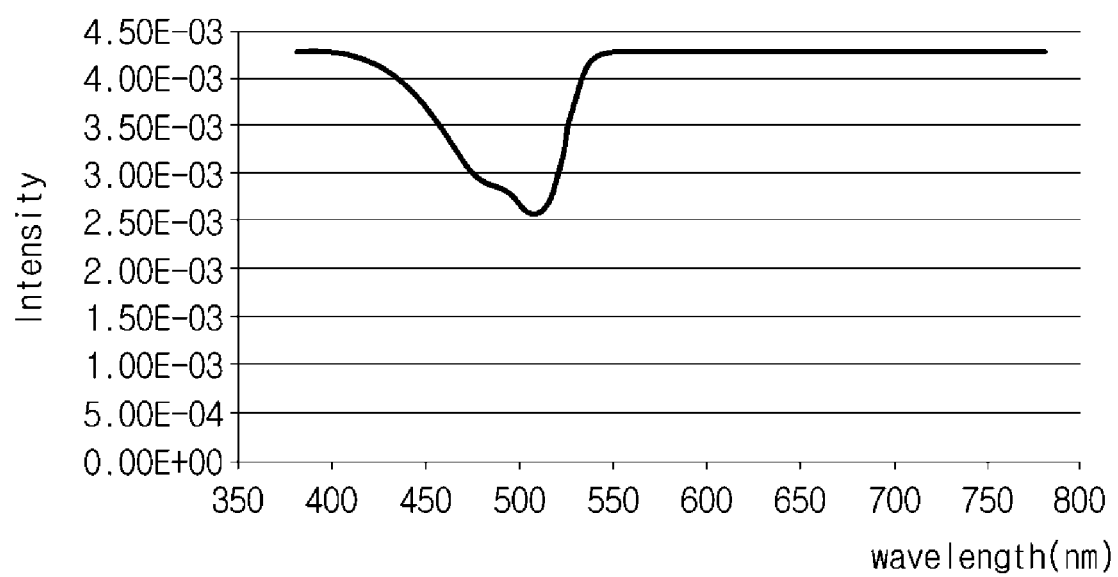
FIG. 5 is a graph illustrating a light absorbing spectrum of absorbing pigments.
Figure 6:
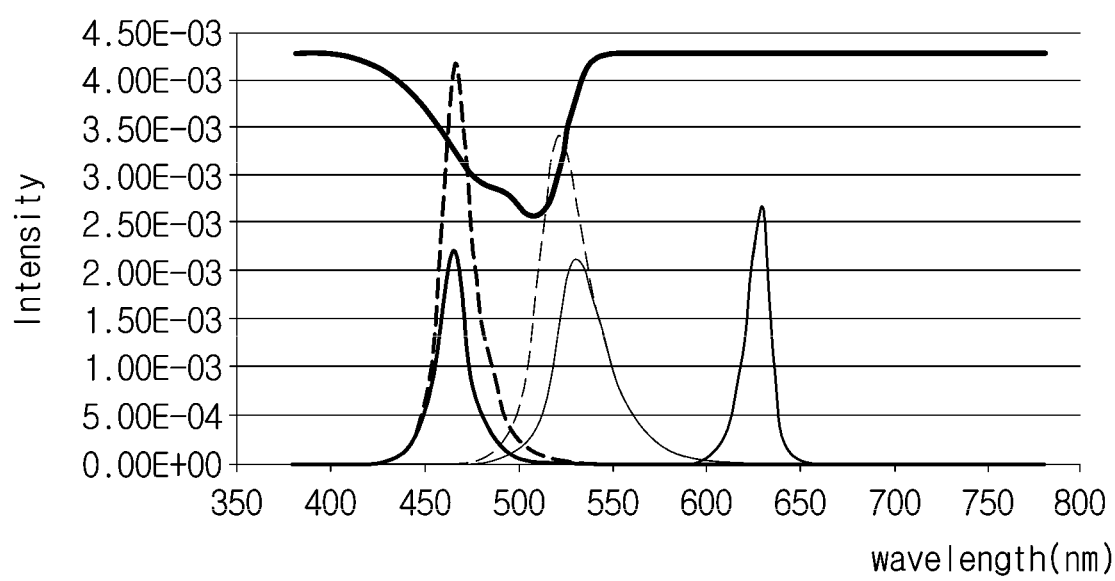
FIGS. 6 and 7 are views illustrating light spectrum change based on the absorbing pigments.
Figure 7:
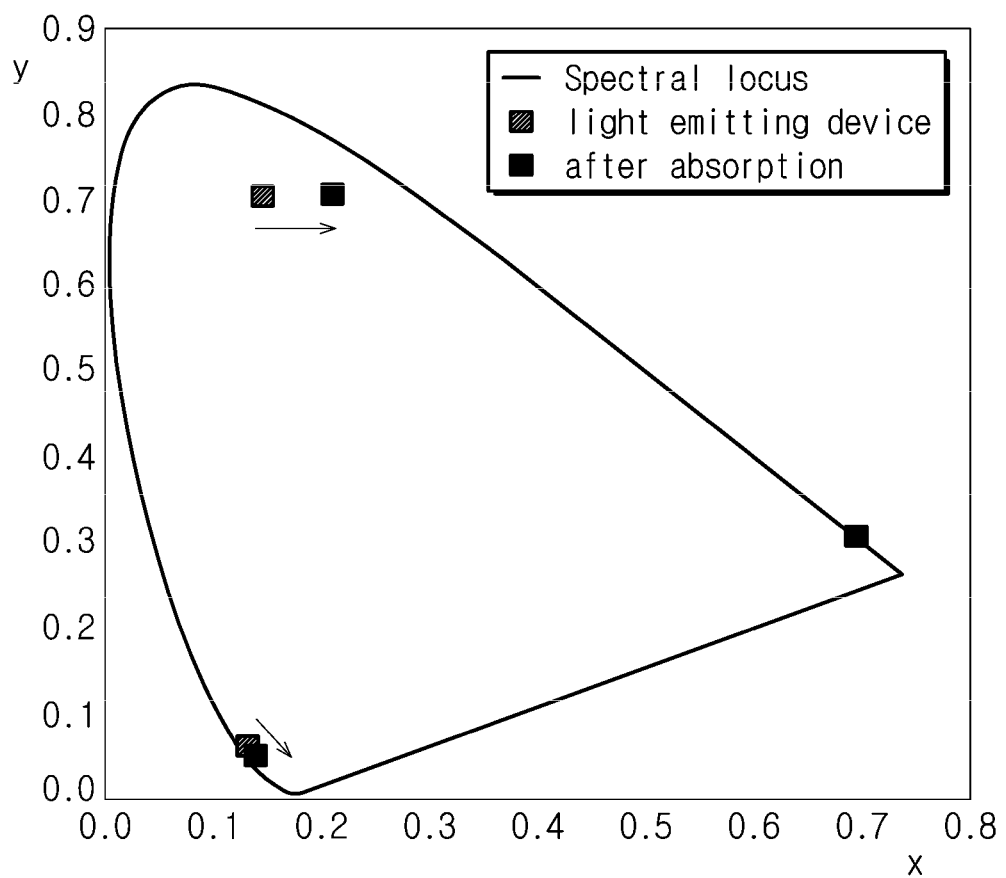

FIG. 5 is a graph illustrating a light absorbing spectrum of the absorbing pigments (A). FIGS. 6 and 7 are views illustrating light spectrum change based on the absorbing pigments (A).

Referring to FIG. 5, the absorbing pigments (A) may have a peak value in the wavelength range from 490 nm to 520 nm, and may have a FWHM ranging from 40 nm to 70 nm. The term "absorbing pigments (A)" may refer to the absorbing pigments (A) satisfying specifications that have not only a peak value in the wavelength range from 490 nm to 520 nm, but also the FWHM ranging from 40 nm to 70 nm.

Since the absorbing pigments (A) have the wavelength range from 490 nm to 520 nm, the absorbing pigments (A) may perform conversion of a color region of blue(B) light and a color region of green(G) light by absorbing some parts of the blue(B) light and the green(G) light.

Referring to FIGS. 6 and 7, the absorbing pigments (A) absorb some parts of the blue(B) light and the green(G) light so that the blue(B) light spectrum and the green(G) light spectrum are changed. The wavelength of the absorbing pigments (A) may not overlap with the wavelength range of red(R) light, such that the red(R) light spectrum is not affected by the absorbing pigments (A).

The disclosure may properly adjust category, density, etc., of the absorbing pigments (A) included in the light emitting device package 100, such that the degree of change in light spectrum of the blue(B) light and the green(G) light can also be adjusted. As a result, the disclosure may provide the light emitting device package 100 satisfying the DCI-P3 reference.

Although the absorbing pigments (A) may be formed of dyes and pigments, embodiments are not limited thereto, and it should be noted that various kinds of absorbing pigments (A) can also be applied to the disclosure within the range capable of satisfying the above-mentioned wavelength and FWHM ranges.

The molding material 138 may further include a light diffusion material for scattering light generated by the light emitting device 110.

A light scattering material may be formed in metal particles. If the light scattering material is formed of metal, light extraction efficiency of the light emitting device package 100 may increase through surface plasmon resonance. Plasmon waves excited and formed by light have characteristics in that the plasmon waves are not propagated from a flat surface of a metal layer to the inside or outside. Since it may be necessary to emit surface plasmon waves to the outside using light, the light scattering material may have a spherical shape.

To this end, the metal constructing the light scattering material may be formed of at least one of gold (Au), silver (Ag), copper (Cu), and aluminum (Al), each of which easily emits electrons by external stimulus and has a negative (−) dielectric constant.

The light emitting device package 100 according to an embodiment has been disclosed as described above. Various modified embodiments will hereinafter be described.

Figure 8:
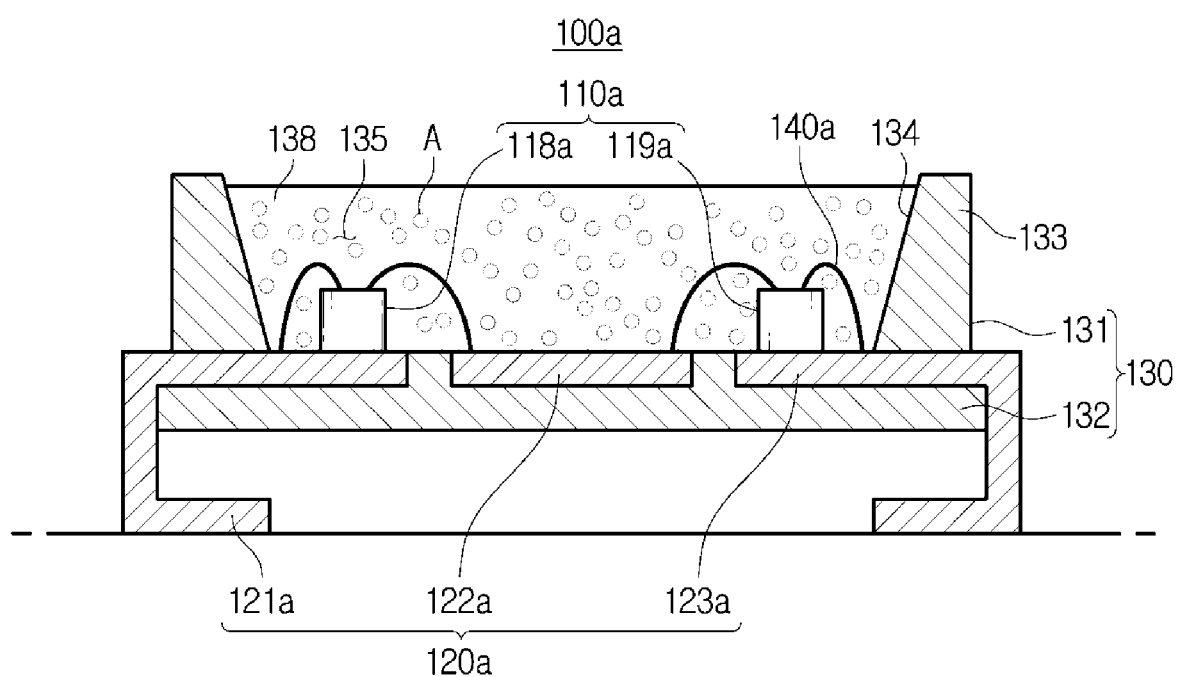
FIG. 8 is a cross-sectional view illustrating a light emitting device package according to another embodiment.

FIG. 8 is a cross-sectional view illustrating a light emitting device package 100*a* according to another embodiment.

Referring to FIG. 8, the light emitting device package 100*a* according to another embodiment may include a light emitting device 110*a* to generate light, a lead frame 120*a* electrically connected to the light emitting device 110*a* to form at least one region located at a bottom surface of the cavity 135, and a body frame 130 provided with the cavity 135 to accommodate the light emitting device 110*a* therein. The body frame 130 of the light emitting device package 100*a* is substantially identical to those of FIGS. 2 and 3, and as such a detailed description thereof will herein be omitted for convenience of description.

Differently from the light emitting device package 100 of FIGS. 2 and 3, the light emitting device package 100*a* shown in FIG. 8 may include a plurality of light emitting devices 110*a* (including 118*a*, 119*a*) in the cavity 135, may have an arrangement structure of the light emitting devices 110*a* (including 118*a*, 119*a*) and the lead frames 120*a* (including 121*a*, 122*a*, 123*a*), and may have a connection structure between the light emitting devices 110*a* (118*a*, 119*a*) and the lead frames 120*a* (121*a*, 122*a*, 123*a*).

In more detail, the light emitting device package 100*a* of FIG. 8 may include two light emitting devices 110*a* (118*a*, 119*a*). In addition, the respective light emitting devices 118*a* and 119*a* may be arranged in one lead frame 120*a* (e.g., 121*a*) from among the plurality of lead frames 121*a*, 122*a*, and 123*a*, and may be connected to another lead frame 120*a* (e.g., 122*a*) through a bonding wire 140*a*.

The light emitting devices 110*a* (118*a*, 119*a*) may be at least one kind of light emitting devices 110*a* (118*a*, 119*a*) from among the light emitting devices 110*a* (118*a*, 119*a*) that respectively emit blue(B)-wavelength-band monochromatic light, green(G)-wavelength-band monochromatic light, and red(R)-wavelength-band monochromatic light. In other words, two light emitting devices 110*a* may be the light emitting devices 118*a* and 119*a* that respectively emit the monochromatic lights having the same wavelength band, and may be the light emitting devices 118*a* and 119*a* configured to emit different monochromatic lights having different wavelength bands.

The molding material 138 may include the absorbing pigments (A) through which wavelengths of lights generated by the light emitting devices 110*a* (118*a*, 119*a*) are changed, so that the changed lights can be matched with the DCI-P3 reference. If each of the light emitting devices 110*a* (118*a*, 119*a*) emits blue(B)-wavelength-band monochromatic light or green(G)-wavelength-band monochromatic light, the color region of either the blue(B)-wavelength-band monochromatic light or the green(G)-wavelength-band monochromatic light emitted from each of the light emitting devices 110*a* (118*a*, 119*a*) may be changed by the absorbing pigments (A). In association with the absorbing pigments (A), the same content as in the above-mentioned description will herein be omitted for convenience of description.

Figure 9:
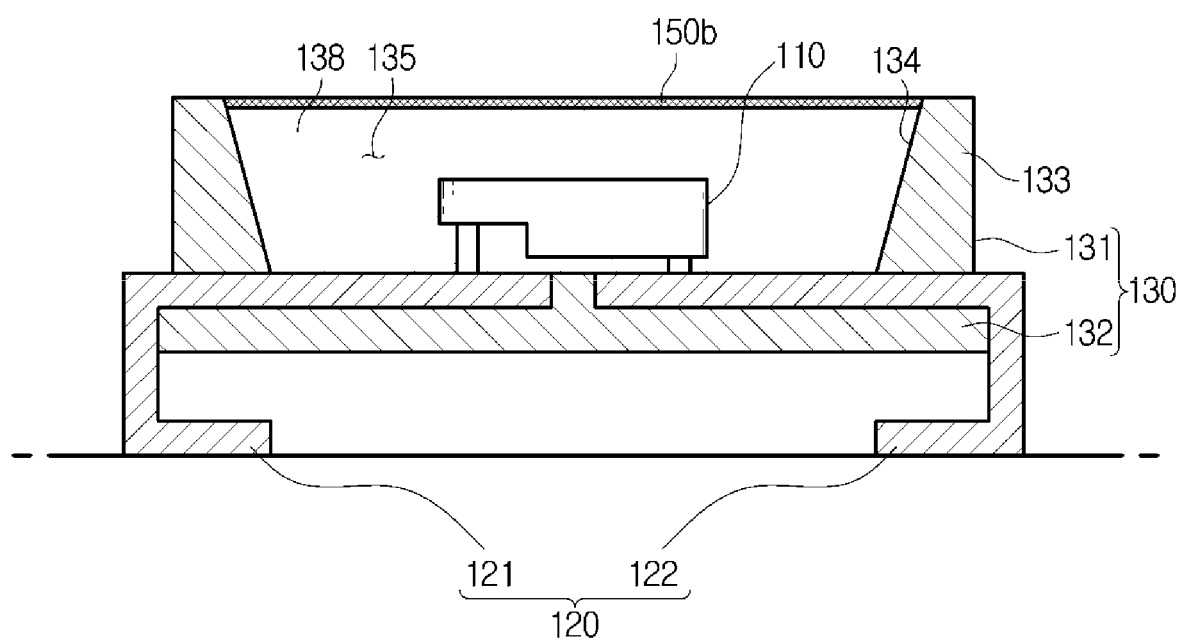
FIG. 9 is a cross-sectional view illustrating a light emitting device package according to another embodiment.
Figure 10:
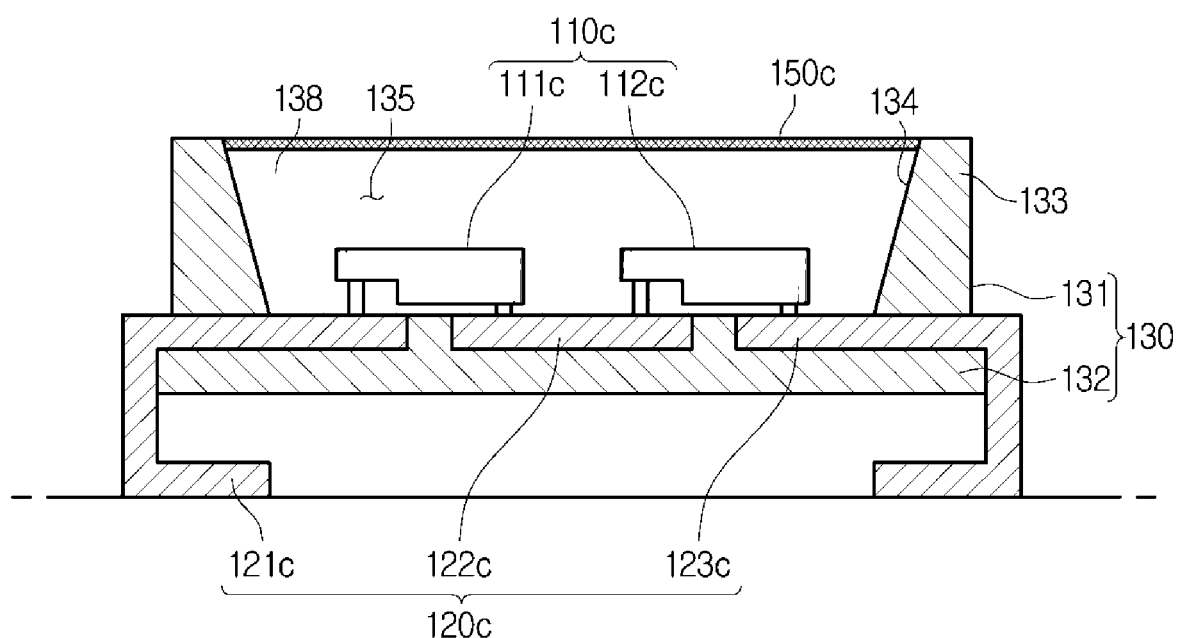
FIG. 10 is a cross-sectional view illustrating a light emitting device package according to another embodiment.

FIG. 9 is a cross-sectional view illustrating a light emitting device package 100b according to another embodiment. FIG. 10 is a cross-sectional view illustrating a light emitting device package 100c according to another embodiment.

Differently from the above-mentioned light emitting device packages 100 and 100a, the light emitting device package 100b of FIG. 9 may be implemented by attaching a film 150b having the absorbing pigments (A) thereto, and the light emitting device package 100c of FIG. 10 may be implemented by attaching a film 150c having the absorbing pigments (A) thereto.

In more detail, the light emitting device package 100b of FIG. 9 may include a light emitting device 110 to generate light, at least one lead frame 120 (121, 122) electrically connected to the light emitting device 110 to form at least one region located at a bottom surface of the cavity 135, and at least one body frame 130 (131, 132) provided with the cavity 135 to accommodate the light emitting device 110 therein.

The cavity 135 may be filled with a molding material 138 that protects the light emitting device from the outside by enclosing the light emitting device. The cavity 135 may be filled with the molding material 138 covering a side of the light emitting device 110, such that the molding material 138 may isolate the light emitting device 110 from the outside to protect the light emitting device from external invasive material or the like.

The upper part of the molding material 138 may include the film 150b having the absorbing pigments (A). The film 150b may be fabricated to include the absorbing pigments (A) in a fabrication process of the film 150b. In the fabrication process of the light emitting device package 100b, the film 150b may cover the upper part of the light emitting device package 100b. In this case, the absorbing pigments (A) may be identical in category to the absorbing pigments (A) included in the molding material 138 illustrated in the above-mentioned embodiments.

Category and density of the absorbing pigments (A) may be changeable in the objective range within which a wavelength of light generated by the light emitting device 110 is changed and the resultant light is matched with the DCI-P3 reference.

The light emitting device package 100b according to another embodiment may include at least two light emitting devices 110c (111c, 112c) shown in FIG. 10 based on the light emitting device package 100b of FIG. 9, as necessary.

Each of the light emitting devices 110c (111c, 112c) may be at least one kind of light emitting devices 110c (111c, 112c) from among the light emitting devices 110c (111c, 112c) that respectively emit blue(B)-wavelength-band monochromatic light, green(G)-wavelength-band monochromatic light, and red(R)-wavelength-band monochromatic light. In other words, two light emitting devices 110c (111c, 112c) may be the light emitting devices that respectively emit the monochromatic lights having the same wavelength band, or may be the light emitting devices configured to emit monochromatic lights having different wavelength bands.

Figure 11:
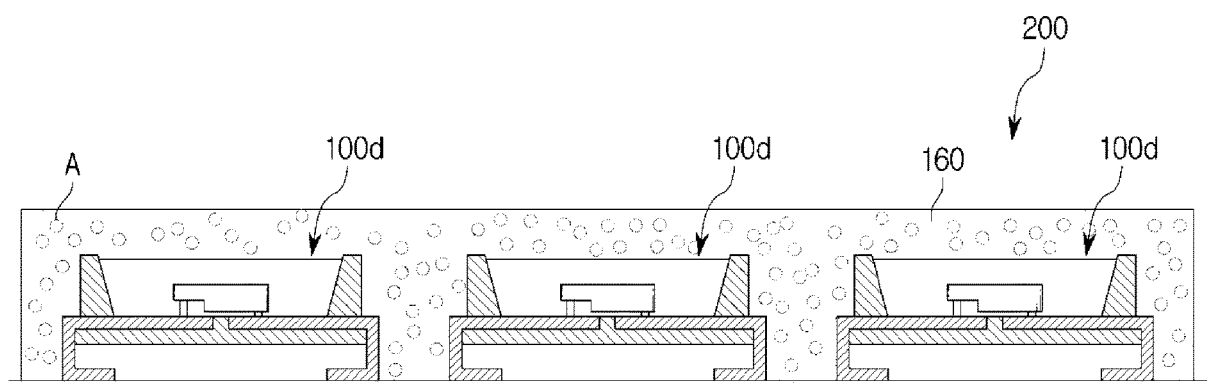
FIG. 11 is a cross-sectional view illustrating a light emitting device package module according to another embodiment.
Figure 12:
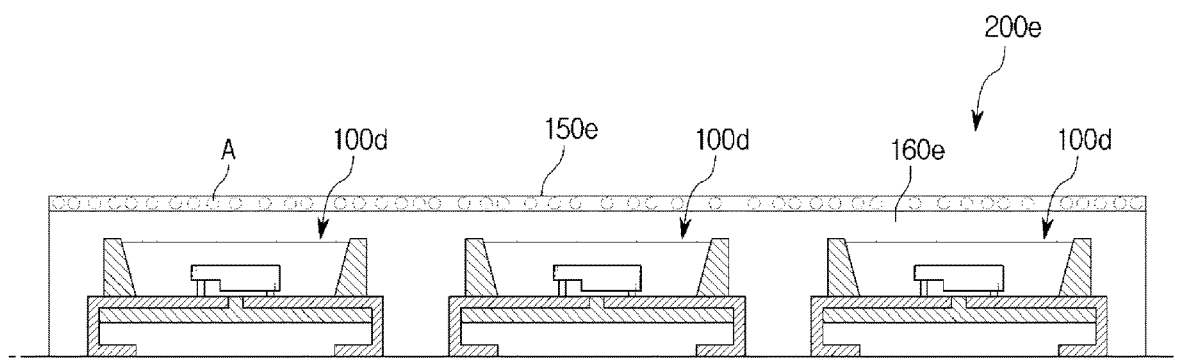
FIG. 12 is a cross-sectional view illustrating a light emitting device package module according to another embodiment.

FIG. 11 is a cross-sectional view illustrating a light emitting device package module 200 according to another embodiment. FIG. 12 is a cross-sectional view illustrating a light emitting device package module 200e according to another embodiment.

FIG. 11 illustrates a light emitting device package module 200 in which the absorbing pigments (A) are applied to a process in which light emitting device packages are arranged in an array shape and then modularized. FIG. 12 illustrates a light emitting device package module 200e in which the absorbing pigments (A) are applied to a process in which light emitting device packages are arranged in an array and then modularized.

Referring to FIG. 11, the light emitting device package module 200 may include a plurality of light emitting device packages 100d, a molding layer 160 formed to enclose the plurality of light emitting device packages 100d, and absorbing pigments (A) included in the molding layer 160.

The light emitting device packages 100d may be light emitting device packages that respectively emit monochromatic lights having the same wavelength band, or may be light emitting devices configured to emit monochromatic lights having different wavelength bands.

For example, the light emitting device packages 100d may be light emitting device packages that respectively emit blue(B)-wavelength-band monochromatic light, green(G)-wavelength-band monochromatic light, and red(R)-wavelength-band monochromatic light. In accordance with the embodiments, the light emitting device packages 100d may include a light emitting device package configured to emit the blue(B)-wavelength-band monochromatic light, and at least one light emitting device package configured to emit light having another wavelength band different from the blue(B) wavelength band.

The molding layer 160 may include the absorbing pigments (A) through which wavelengths of lights generated by the light emitting device packages 100d are changed, so that the changed lights can be matched with the DCI-P3 reference. The absorbing pigments (A) may perform conversion of the color region of monochromatic light having a green (G) or blue(B) wavelength band emitted from the light emitting device 100d, such that the light emitting device package module 200 according to the disclosure may provide light matched with the DCI-P3 reference.

Category and density of the absorbing pigments (A) included in the molding layer 160 may change the wavelength of light generated by the light emitting device package 100d in consideration of various variables, for example, the height of the light emitting device package 100d, category and height of the molding material included in the light emitting device package 100d, the height of the molding layer 160, etc., such that the resultant light can be adjusted in the objective range matched with the DCI-P3 reference.

Referring to FIG. 12, the light emitting device package module 200e according to another embodiment may include the plurality of light emitting device packages 100d, a molding layer 160e formed to enclose the plurality of light emitting device packages 100d, a film 150e formed over the molding layer 160e, and absorbing pigments (A) included in the film 150e. Differently from the light emitting device package module 200 shown in FIG. 11, the light emitting device package module 200e shown in FIG. 12 may provide the absorbing pigments (A) included in the film 150e instead of the molding layer 160e. The embodiment of FIG. 12 will hereinafter be described centering upon unique characteristics different from those of FIG. 11.

The film 150e may be fabricated to include the absorbing pigments (A) in the fabrication process thereof. Category and density of the absorbing pigments (A) included in the film 150e may change the wavelength of light generated by the light emitting device package 100d in consideration of various variables, for example, the height of the light emitting device package 100d, the molding material included in the light emitting device package 100d, the height of the molding layer 160e, thickness of the film 150e, etc., such that the resultant light can be adjusted within the objective range matched with the DCI-P3 reference.

Although embodiments of the light emitting device package modules 200 and 200e have been disclosed, methods for providing the light emitting device package modules 200 and 200e are not limited to the above examples. That is, although the light emitting device package modules 200 and 200e shown in FIGS. 11 and 12 may be configured in a manner that the absorbing pigments (A) are not included in the molding material of the light emitting device package 100d and are included in a separate molding layer 160 or a separate film 200e, it should be noted that the molding material of the light emitting device package 100d is filled with the absorbing pigments (A), or the light emitting device package having the molding material filled with the absorbing pigments (A) and the other light emitting device package having the molding material not filled with the absorbing pigments (A) are combined with each other as necessary.

If the light emitting device package having the molding material filled with the absorbing pigments (A) is modularized, the light emitting device package module according to the disclosure may be provided as any of available combinations achieved when the light emitting device packages 100, 100a, 100b, and 100c of FIGS. 2 to 10 are modularized. In this case, the molding layer or the film may be configured not to include the absorbing pigments (A), and the absorbing pigments (A) may have a relatively low density.

Various embodiments of the light emitting device package modules 200 and 200e have been disclosed as described above. A cabinet may be formed by a combination of the light emitting device package modules 200 and 200e. Although the cabinet may be fabricated to have a horizontal size of 1 to 2 meters and a vertical size of 0.5 to 1 meters, embodiments are not limited thereto.

The plurality of cabinets may be interconnected to provide a large screen. That is, several cabinets may be interconnected to construct a 2K(FHD: Full HD) screen and a 4K(UHD: Ultra HD) screen, such that the 2K screen or 4K screen may be installed in places (e.g. theaters) that require large screens.

The light emitting device packages 100, 100a, 100b, and 100c and the light emitting device package modules 200 and 200e according to the disclosure may provide large screens that implement colors and definition satisfying the DCI-P3 reference, such that the large screens may substitute for conventional projectors and screens used in theaters.

As is apparent from the above description, the embodiments may provide a light emitting device package optimized to allow color regions of a light source according to absorbing pigments to satisfy the DCI-P3 color gamut reference, and a light emitting device package module for the same.

In addition, the embodiments may minimize a dispersion of bins in a scatter plot due to absorbing pigments included in the light emitting device package.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A light emitting device package comprising:
   a light emitting device configured to generate light;
   a body frame comprising a cavity in which the light emitting device is mounted;
   a molding material that fills the cavity; and
   absorbing pigments that convert the light generated by the light emitting device,
   wherein the absorbing pigments have a peak value within a wavelength range of 490 nm to 520 nm and a full width at half maximum (FWHM) of 40 nm to 70 nm,
   wherein the peak value comprises a peak absorption value of the absorbing pigments.

2. The light emitting device package according to claim 1, wherein the absorbing pigments are included in the molding material.

3. The light emitting device package according to claim 1, further comprising:
   a film provided over the molding material,
   wherein the absorbing pigments are included in the film.

4. The light emitting device package according to claim 1, wherein the absorbing pigments are provided in at least one from among dyes and pigments.

5. The light emitting device package according to claim 1, wherein the absorbing pigments convert green (G) light generated by the light emitting device into light having a wavelength band of 540 nm to 545 nm.

6. The light emitting device package according to claim 1, wherein the absorbing pigments convert blue (B) light generated by the light emitting device into light having a wavelength band of 460 nm to 464 nm.

7. The light emitting device package according to claim 1, further comprising:
   a plurality of light emitting devices mounted in the cavity.

8. A light emitting device package module comprising:
   a plurality of light emitting device packages; and
   absorbing pigments that convert light generated by the light emitting device packages,
   wherein the absorbing pigments have a peak value within a wavelength range of 490 to 520 nm and a full width at half maximum (FWHM) of 40 to 70 nm, and
   wherein each light emitting device package among the plurality of light emitting device packages comprises:
      a light emitting device configured to generate light, a body frame comprising a cavity in which the light emitting device is mounted, a molding material that fills the cavity, and the absorbing pigments included in the molding material,
   wherein the peak value comprises a peak absorption value of the absorbing pigments.

9. The light emitting device package module according to claim 8, wherein the absorbing pigments are provided in at least from among dyes and pigments.

10. The light emitting device package module according to claim 8, wherein the absorbing pigments convert green (G) light generated by the light emitting device into light having a wavelength band of 540 to 545 nm.

11. The light emitting device package module according to claim 8, wherein the absorbing pigments convert blue (B) light generated by the light emitting device into light having a wavelength band of 460 to 464 nm.

12. A light emitting device package module comprising:
    a plurality of light emitting device packages;
    absorbing pigments that convert light generated by the light emitting device packages; and a molding layer enclosing the plurality of light emitting device packages,
    wherein the absorbing pigments have a peak value within a wavelength range of 490 to 520 nm and a full width at half maximum (FWHM) of 40 to 70 nm,
    wherein the peak value comprises a peak absorption value of the absorbing pigments.

13. The light emitting device package module according to claim 12, wherein the absorbing pigments are included in the molding layer.

14. The light emitting device package module according to claim 12, further comprising:
   a film provided over the molding layer,
   wherein the absorbing pigments are included in the film.

\* \* \* \* \*